(12) United States Patent
Prokofiev et al.

(10) Patent No.: US 8,545,942 B2
(45) Date of Patent: Oct. 1, 2013

(54) METHOD FOR PRODUCING CLATHRATE COMPOUNDS

(75) Inventors: Andrey Prokofiev, Vienna (AT); Silke Bühler-Paschen, Vienna (AT); Herbert Sassik, Vienna (AT); Stefan Laumann, Eisenstadt (AT); Peter Pongratz, Vienna (AT)

(73) Assignee: Technische Universitä Wien, Vienna (AT)

( * ) Notice: Subject to any disclaimer, the term of this patent is extended or adjusted under 35 U.S.C. 154(b) by 1297 days.

(21) Appl. No.: 12/231,183

(22) Filed: Aug. 29, 2008

(65) Prior Publication Data

US 2009/0291297 A1    Nov. 26, 2009

(30) Foreign Application Priority Data

May 21, 2008   (AT) ................. GM295/2008

(51) Int. Cl.
| | |
|---|---|
| *B05D 1/34* | (2006.01) |
| *B05D 1/40* | (2006.01) |
| *C22C 13/00* | (2006.01) |
| *C22C 21/00* | (2006.01) |
| *C01B 33/00* | (2006.01) |

(52) U.S. Cl.
USPC ................ 427/404; 148/400; 423/324

(58) Field of Classification Search
None
See application file for complete search history.

(56) References Cited

U.S. PATENT DOCUMENTS

| | | | | |
|---|---|---|---|---|
| 6,103,403 | A | * | 8/2000 | Grigorian et al. ............. 428/641 |
| 2003/0197156 | A1 | * | 10/2003 | Eguchi et al. ................. 252/500 |

OTHER PUBLICATIONS

S.Paschen et al., Investigation of Yb substitution in the clathrate phase Eu8Ga16Ge30, Journal of Crystal Growth 310 (2008) 1853-1858.*
Bobev et al.,Naked Clusters of 56 Tin Atoms in the Solid State, JACS, 2002,124,3359-3365.*
Kovnir et al., Semiconducting clathrates: synthesis, structure and properties, Russian Chemical Reviews 73, 9, 923-938, 2004.*
Grossinger et al., Radex-Russchau, Amorphous Alloys, 1988, Heft 2/3, pp. 146-149.*
Ishikura et al.,Structure Analysis of Molten Ba-Ge Alloys Using Electrostatic Levitation Technique Combined With High-Energy X-Ray Diffraction, J. Am. Ceram. Soc., 90, 3, 738-741, 2007.*

* cited by examiner

*Primary Examiner* — James Lin
*Assistant Examiner* — Francisco Tschen
(74) *Attorney, Agent, or Firm* — Drinker Biddle & Reath LLP

(57) ABSTRACT

The present invention relates a method for producing clathrate compounds, comprising producing a homogeneous melt containing the desired elements in the desired ratio, and subsequently solidifying said melt to obtain the clathrate compound by quickly cooling the melt.

24 Claims, 3 Drawing Sheets

_US 8,545,942 B2_

METHOD FOR PRODUCING CLATHRATE COMPOUNDS

FIELD OF THE INVENTION

The present invention relates to methods for producing clathrate compounds from a melt of their constituents.

BACKGROUND ART OF THE INVENTION

Clathrate or cage inclusion compounds have been known for about 200 years and their deliberate production for about 60 years. The first examples discovered were clathrate hydrates, i.e. enclosures of gas molecules (e.g. $Cl_2$) in ice lattices. Today, especially intermetallic clathrates, known since the 1960s, are subject to extensive research because of their high application potential, particularly in thermoelectric modules. See for example U.S. Pat. No. 5,800,794A1, U.S. Pat. No. 6,188,011B1 and U.S. Pat. No. 6,525,260B2. Intermetallic clathrates are classified into 9 different structural types, of which type 1 has been investigated most extensively, which is why numerous representatives thereof are known. FIG. 1 is a schematic representation of the structure of such a clathrate compound, wherein the larger spheres in the right half of the drawing represent the atoms encapsulated in the cage.

Regarding the term "clathrate", it should be noted that herein its definition includes mainly compounds in which the cage-forming atoms provide a space-filling network, although the definition of "clathrate" may sometimes, especially in English, comprise all sorts of inclusion compounds.

Components used for intermetallic clathrates may be various combinations of elements. EP 1,074,512 A1, for example, which largely corresponds to U.S. Pat. No. 6,461,581B1, discloses cage inclusion compounds wherein one or more elements from group 4A, especially C or Si, form the matrix, i.e. the "cage", together with so-called "substitution atoms", which may be selected from almost all other elements of the periodic table—except for hydrogen, technetium, the rare gases and the transuranium elements. In the above documents, the enclosable atoms may also be selected within a broad range: atoms from groups 1A to 3A as well as those of transition elements—except for group 7B (Mn, Tc, Re) and the transuranium elements—may be enclosed in the matrix. Generally, at the moment it is preferred to use atoms of groups 1A and 2A as inclusion components and, for example, Ga, Ge and Si as cage components.

The production of such clathrates is usually effected by melting down the elements, which, after cooling the mixture to below the melting range, usually results in various phases which either do not yet comprise the desired clathrate compounds at all or only comprise too small proportions of the desired solid clathrate compound in combination with undesired, interfering foreign phases. Thus, in order to obtain phase-pure clathrate compounds, a subsequent heat treatment at temperatures of several hundred degrees Celsius is necessary, usually for a period of several days or even weeks, until a substantially pure, solid phase of the desired clathrate is obtained.

One variation of these methods includes hot compression molding or discharge plasma sintering of powders of the starting materials at about 700° C., which may accelerate the production method (see, for example, U.S. Pat. No. 6,525, 260B2).

Nevertheless, in addition to the disadvantage of being very time-consuming, all known methods also require large amounts of energy for reaching and maintaining the necessary temperatures of several hundred degrees Celsius during heat treatment.

Furthermore, the clathrate compounds thus obtained usually are in the form of blocks or compact masses and have to be mechanically processed by laborious methods for later use. Actually, thin layers of clathrate compounds have also been produced. However, this requires laborious pulsed laser ablation or helicon magnetron sputtering methods, and the thickness of the resulting layers measures only several nanometers.

Therefore, a method would be desirable, which allows a) the production of clathrate compounds with layer thicknesses in the micrometer range within a short period of time and with relatively low energy demand, b) the production of clathrates directly on a workpiece or article to be coated therewith, so that such articles may be produced quickly and inexpensively, and c) the production of clathrates with higher purity and improved properties.

DESCRIPTION OF THE INVENTION

Figure 1:
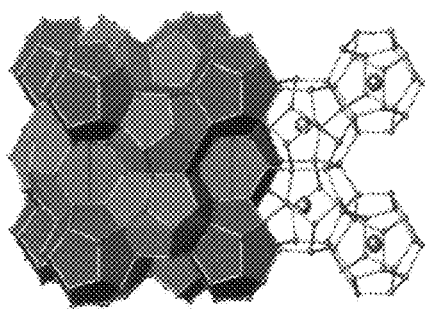
FIG. 1 is a schematic drawing showing the structure of a clathrate obtainable according to the inventive method.

In a first aspect, the present invention achieves these objects by providing a method for producing clathrate compounds, which comprises producing a homogeneous melt containing the desired elements in the desired ratio, and subsequently solidifying said melt to obtain the clathrate compound by quickly cooling, i.e. quenching, the melt.

Diametrically opposed to the state of the art, according to which the solidified melt must be heated ("annealed") for an extended period of time to enable the formation of phases of the desired cage inclusion compounds, the present inventors have found that the desired clathrate compounds also form when such a melt is quenched, which saves a lot of time and energy and consequently also reduces costs.

Without wishing to be bound by any specific theory, the inventors assume that the forming mechanism of the clathrates in the method according to the invention is based on the fact that, during such quick cooling, the solid, crystalline phase of the matrix, i.e. of the "cage", is formed faster than the phase separation of the inclusion component(s) not yet crystallized takes place, so that atoms of the latter are trapped and enclosed in the solid matrix. This also allows the production of clathrates with very high phase purity, i.e. with proportions of foreign phases that are hardly detectable by conventional methods such as x-ray powder diffraction and scanning electron microscopy. Foreign phases that may be detectable with a transmission electron microscope typically have a submicron structure, i.e. they are present between the grains or crystallites of the desired clathrate phase as an intergranular phase having a thickness of 0.05 to 0.1 μm, whereas according to the state of the art impurities are usually present in the form of isometric grains having a diameter of 10 to 100 μm. This improves not only the compliance with the desired atomic ratios but also the properties such as the thermopower of the material produced according to the method of the invention.

If desired, such minor impurities of foreign phases may be removed conventionally by heat treating, i.e. annealing, the clathrates, wherein, however, due to the minor proportion and the submicrostructure of said impurities, the duration of the heat treatment is much shorter and annealing may be effected at considerably lower temperatures than according to the state of the art.

The "desired ratio" does not necessarily mean exact stoichiometric ratios, because sometimes especially good results are obtained with clathrates of elements in non-stoichiometric, i.e. non-integral, proportions.

Basically, the inventive method may be used for virtually all known clathrate compounds, i.e. for clathrates based on organic compounds as well as for inorganic compounds, such as intermetallic clathrates. In the case of organic compounds, "elements" for producing the melt refers to the respective "molecules" for forming the lattice or inclusion components. In this regard, it should be noted that, depending on context and language, "intermetallic" does not only include the classical metallic elements, but also semimetals and occasionally even carbon. Herein, this term is to be understood in its broadest sense. Preferably, such intermetallic clathrates are produced according to the inventive method, because here the factors of time and costs are of special importance.

The selection of the matrix and inclusion components is not particularly limited. However, preferred matrix or cage components are one or more elements selected from Si, Ge, Sn, Pb, Al, Ga, In, and transition elements, and preferred inclusion components are one or more elements selected from alkali metals, alkaline earth metals, transition elements, including lanthanoids and actinoids, more preferably from alkaline earth metals and lanthanoids and sometimes also actinoids, since these elements are currently preferred for producing clathrates for thermoelectric and semiconductor uses.

When the components are selected appropriately, the inventive method offers another advantage, namely that of providing a comparably simple solution for a highly topical problem that has not yet been solved satisfactorily according to the state of the art: the improvement the thermopower of clathrates by introduction of "f-elements", i.e. lanthanoids or (less preferably) actinoids, into the cages of clathrate structures.

During the formation of the clathrate phase, according to the state of the art the atoms of the f-element to be incorporated into the cage are driven out of the clathrate structure, a process called "segregation", because in addition to the clathrate phases other, thermodynamically more stable phases containing the f-element may form. According to the inventive method, quick quenching allows the formation of metastable crystalline phases with f-elements as inclusion atoms. Since these are entrapped in a cage and thus virtually "frozen" in the clathrate phase, they are prevented from segregating.

Since the thermal conductivity of numerous clathrates produced according to the inventive method is considerably lower that that of pure metals, the inventive method preferably comprises quenching thin layers or droplets of the melt with a thickness or diameter, respectively, of less than 300 μm, preferably less than 100 μm, in order to accelerate their cooling rate. In addition, the solid clathrate compound formed by quick cooling is directly obtained in the form of a thin film or granulate, so that some later processing steps—which are absolutely required according to the state of the art where usually blocks of the clathrates are obtained—may be omitted. Of course, the layers or droplets obtained according to the inventive method can, if desired, also be compacted to blocks by known methods, e.g. hot pressing or spark plasma sintering.

As explained above with regard to the mechanism of clathrate formation, the core of the invention is quickly cooling or quenching the melt. The required cooling rate depends on the components of the respective clathrate compound and is not particularly limited as long as the desired clathrate is obtained. However, the inventors have found that especially good results with regard to phase purity are obtainable with cooling rates of at least $10^3$ K/s, preferably at least $10^5$ K/s.

The method for quickly cooling the melt is not particularly limited and may, in a preferred embodiment, comprise introducing the melt into a cooling agent. The melt may for example be injected into a cooling gas or into a cooling liquid through a nozzle, e.g. by using an inert gas as carrier, concurrently with being atomized into fine droplets. Alternatively, the melt may be loaded into an, optionally heated, mold or be produced directly therein from powders of the starting components, followed by introducing the mold into the cooling agent, e.g. by immersion. The cooling agent used may for example be nitrogen, rare gases or other gases or liquids, e.g. liquefied inert gases, which are not capable of any reactions with the clathrate components under the process conditions.

Especially when a large volume thereof is available for cooling, optionally comprising mixing the same during the cooling process for better heat distribution, the cooling agent may be present at room temperature. However, in order to increase the cooling rate, the cooling agent is preferably (pre-)cooled to a temperature of <5° C.

In preferred embodiments, the quick cooling of the melt is effected by distribution on a surface, which thus serves as a solid cooling agent, on which the melt solidifies into the desired clathrate compound. The surface preferably consists of a material having a high thermal conductivity, such as copper or silver, without being limited thereto. As with cooling in liquid or gaseous cooling agents, the surface is cooled before and/or during the distribution of the melt thereon, again especially preferred to a temperature of <5 C. Cooling of the surface may be effected in any way desired, for example by blowing or spraying an auxiliary cooling agent, e.g. an—optionally liquefied—inert gas, thereon or by means of a cooling device having a heat conductive connection with the surface, such as a cooling jacket or the like.

In preferred embodiments, the melt is sprayed onto the surface through a nozzle and finely distributed thereon, which again increases the cooling rate. For the same purpose of fine distribution, the surface and the nozzle may be moved in relation to each other during application of the melt, which comprises the movement of only one of them as well as of both of them at the same time.

The type of movement is not particularly limited. However, in particularly preferred embodiments, the surface is rotated at a defined distance from the nozzle, whereby the invention may be carried out by use of melt spinning methods and devices. This method is usually used for producing amorphous and nanocrystalline intermetallic or ceramic materials as well as polymeric fibers and is thus well known and adjustable to the requirements of the inventive methods with only minor adaptations. Melt spinning unites some of the above and below illustrated preferred characteristics of the inventive method such as cooling rates of $10^5$ to $10^7$ K/s being achievable by this method.

Rotation of the surface is preferably effected with rotational speeds of at least 1,300 rpm, which on the one hand guarantees especially good distribution of the melt on the rotating surface, and on the other hand corresponds to conventional rotational speeds in melt spinning, for which existing devices are designed.

Alternatively or additionally to the rotational movement of the surface, the nozzle may also be moved across the surface during spraying of the melt, e.g. by motor power, which also provides a larger surface for cooling within a short period of time.

In alternative embodiments of the invention, the melt is kept in electromagnetic levitation before cooling and allowed to fall into a cooling agent or onto a surface by discontinuing the state of levitation, in the latter case again being distributed on the surface and being thus cooled. In this case, the melt can for example also be produced according to a known levitation melting method, e.g. by induction heating. For further improving distribution and thus cooling, the melt is preferably flattened between two surfaces, again optionally cooled, after discontinuation of the state of levitation.

As can be seen from the above discussion, the object of particularly quick cooling, i.e. quenching, the clathrate precursor melt is primarily achieved by distributing it in or on a cooling agent as finely as possible. As mentioned above, this can be achieved in different ways, which may also be combined. When distributing the melt on a surface as described above, the surface may also be surrounded by a cooling gas and/or completely or partly be immersed into a cooling liquid, and it may concurrently be moved in relation to a nozzle for spraying the melt thereon.

In particularly preferred embodiments, the melt is directly distributed on, preferably sprayed onto, a surface of a substrate or article to be coated with the clathrate compound, which strongly improves the production efficiency in the manufacture of such articles. The articles or "substrates" for such direct coating with clathrate compounds are not particularly limited. For example, semiconductor wafers or thermoelectric or electrothermal components, such as thermoelectric generators for converting waste heat into electrical energy, e.g. sheet metal for exhaust pipes or chimney linings, as well as Peltier elements for active cooling can be produced far more economically according to the inventive method than it has been possible so far, particularly since the articles onto which the clathrate precursor melt is preferably sprayed may have virtually any shape.

The surface of the article to be thus coated with a clathrate compound may be pretreated to improve adhesion of the clathrate layer, which comprises surface patterning, e.g. roughening and the like, as well as the application of an adhesive layer or primer coating. The latter are preferably also made of materials with good heat conduction and may for example consist of a thin layer, e.g. 10 to 200 µm, of a low-melting metal, such as Ga or Sn, which shows incipient melting at the surface when contacted with the hot melt, so that the adhesive layer and the clathrate layer are firmly joined to each other.

In a second aspect, the invention relates to such an article having a coating of a clathrate compound produced by the inventive method, wherein the coating again preferably has a layer thickness of 10 to 300 µm, preferably 10 to 100 µm, and may have an adhesive or primer layer described above thereunder. Examples for such articles have been mentioned above.

Moreover, a last aspect of the invention relates to the especially preferred production of clathrate compounds by use of melt spinning methods and devices described above.

EXAMPLES

In the following, the invention will be described by way of working examples, which are meant to be illustrative and not limiting.

Example 1

Preparation of Clathrates by Melt Spinning

General Procedure

Some of the intermetallic clathrate compounds mentioned below were produced as follows by means of a melt spinning device. First, powder mixtures of the desired elements in the desired ratios with total weights of at least 1 g each were molten in a water-cooled copper channel by means of high-frequency heating, transferred into carbon-coated quartz vials, kept in the liquid state for a period of several hours for homogenization, and then allowed to solidify.

Subsequently, the material was subjected to induction melting in vertical, conical quartz tubes having lower aperture slits with dimensions of 0.3-0.5 mm×2-5 mm serving as nozzles and upper feed apertures with diameters of 10 to 20 mm, the melt remaining in the quartz tube due to capillary forces. The quartz tube was placed in a melt spinning device at a distance of 0.3 mm above the surface of a copper wheel having a diameter of 30 cm and a width of 8 cm, and the wheel was rotated with a speed of 1,300 rpm. The upper aperture of the tube was connected to an argon bottle, and the melt was sprayed onto the rotating copper wheel through the nozzle by means of argon overpressure. The material solidified on the wheel was obtained in the form of lamellas with a thickness of 20 to 50 µm and a surface area of up to 4×20 mm. Before the melt was sprayed thereon, the copper wheel had room temperature, and because of the large mass difference between the wheel and the melt, the temperature of the wheel hardly changed during the spraying procedure. Despite the enormous cooling rates, all of the samples produced had a well-defined crystalline structure without identifiable proportions of amorphous phases.

The following intermetallic clathrate compounds were produced by means of the above melt spinning technique, wherein the underlined elements form the atoms enclosed within the crystal lattice consisting of the other elements: $\underline{Eu}_8Ga_{16}Ge_{30}$, $\underline{Sr}_8Ga_{16}Ge_{30}$, $\underline{Ba}_8Ga_{16}Ge_{30}$, $\underline{Ba}_8Pd_4Ge_{42}$, $\underline{Ba}_8Ni_4Ge_{42}$, $\underline{Ba}_8Au_6Si_{40}$, $\underline{Ba}_8Au_6Ge_{40}$, $\underline{Ba}_8Cu_6Si_{40}$, $\underline{Ba}_8Ga_{16}Sn_{30}$, $\underline{Eu}_2Ba_6Ga_{16}Ge_{30}$ and $\underline{Eu}_4\underline{Sr}_4Ga_{16}Ge_{30}$.

Figure 2:
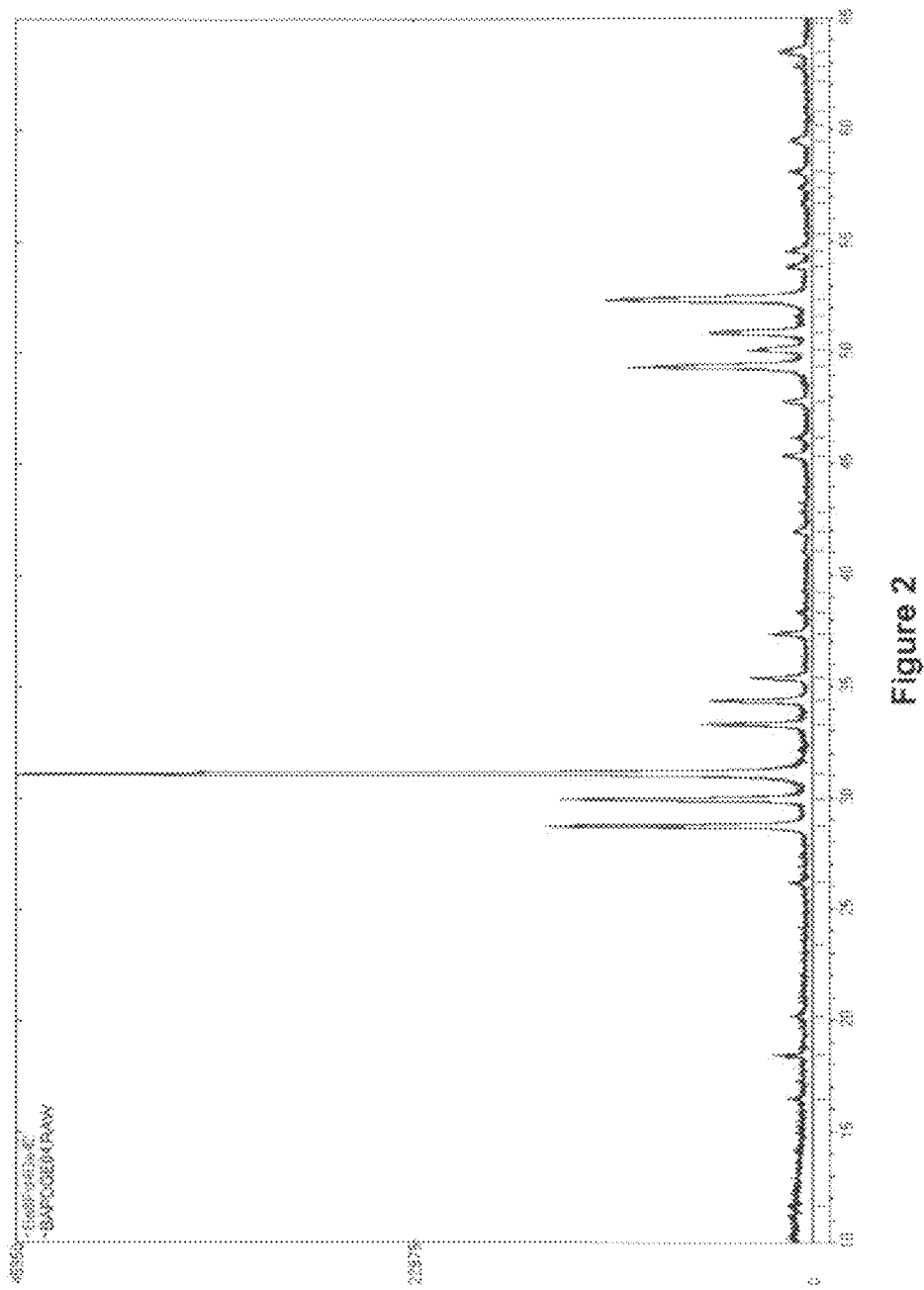
FIG. 2 is the x-ray powder diffractogram of $Ba_8Pd_4Ge_{42}$ obtained in Example 1.

The phase purity of the thin layers of the desired clathrate compounds obtained were examined by x-ray powder diffractometry, the results showing no detectable foreign phases as all measuring data fully corresponded to simulated diffractograms with regard to position and intensity. This means that the proportion of impurities, if present, was always below the detection limit of the detection method (3%). FIG. 2 shows an example of the x-ray powder diffractogram of $Ba_8Pd_4Ge_{42}$ obtained in Example 1.

Example 2

Melt Spinning With Additional Cooling

Example 1 was repeated, except that a thin copper sheet with a width of 5 cm was mounted around the circumference of the wheel and that, simultaneously with spraying on the melt, nitrogen gas with a temperature of about −180 to −170° C. was blown onto the sheet through a second nozzle. To improve the adhesion of the clathrate layer on the sheet, the sheet was precoated by melt spinning with a thin adhesive layer of Sn with a thickness of about 50 µm.

Subsequently, the wheel was rotated with 1,300 rpm as in Example 1, and a melt was sprayed onto the sheet and quickly cooled, which resulted in the formation of a layer of $Sr_8Ga_{16}Ge_{30}$ on the copper sheet. Again, a sample of the clathrate layer showed no foreign phases in the x-ray powder diffractogram.

The copper sheet coated with the clathrate compound thus obtained was removed from the wheel and rolled flat and is highly suitable for producing different kinds of thermoelectric modules.

Example 3

Flattening Between Two Cooling Surfaces

Even higher cooling rates can be achieved by a method based on the squashing of a melt between two cooling surfaces. According to this method, the alloy is melted in a high frequency induction coil, whereafter the molten droplet levitates inside the coil due to the interaction of the magnetic field of the coil with the induced field of the droplet. When the high frequency current is switched off, the molten droplet is released from the state of levitation and falls down. At the same moment, two polished smooth massive copper plates being positioned below the induction coil are moved towards each other with high speed, so that the droplet is squashed between the two plates to form a thin film of the alloy. This thin film can be applied to various substrates such as metal sheets.

This method provides very high quenching rates because the cooling effect is exerted from both sides of the film.

Example 4

Dispersion of the Melt into a Cooling Medium

Figure 3:
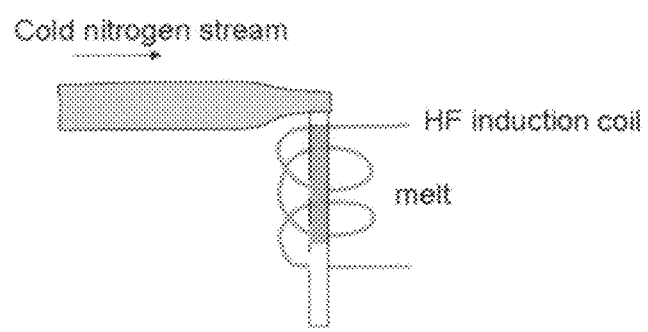
FIG. 3 is a schematic representation of the principle of the method used in Example 4.

A way to obtain rapidly quenched alloys in a different form, i.e. as a fine particle powder, is by dispersing the melt in a cooling medium, such as nitrogen, just above its boiling point (for nitrogen, approx. 77 K). The method is based on the Bernoulli effect and can be realized in a spray nozzle (Venturi nozzle). As schematically shown in FIG. 3, cold nitrogen in its gaseous state is pumped through a tube which ends in a narrower part. In this part, a quartz or ceramic (e.g. $Al_2O_3$) tube is inserted. The tube contains the material to be quenched and is surrounded by an induction coil which keeps the material in the molten state. Due to the lower pressure in the narrow part of the tube (Bernoulli effect), the melt moves up and is dispersed and cooled by the nitrogen stream, so as to obtain a fine dust of the clathrate material. Due to the small particle size of this dust, the cooling of the melt proceeds extremely rapidly.

A similar type of cooling can also be observed in the melt spinning machine used in Examples 1 and 2, when the wheel rotation speed is set to be higher than 2500 rpm. In this case, the wheel sets the air around its surface in motion, and the melt emerging from the upper nozzle is dispersed into a fine powder. However, due to the undirected air movement, the powder is sprayed throughout the chamber.

Example 5

Coating of Large and/or Flat Surfaces

For some applications, coating of large and/or flat surfaces of workpieces with the clathrate material is required, which cannot be realized by standard melt spinning setups. In this case, in contrast to the latter methods, the moving part should be the nozzle dispensing the melt. It moves across the surface with high speed, e.g. 25 m/s, for example linearly, with a shift to the next line after each linear run, or helically. In the latter case, problems connected with decelerating and accelerating the injector head after each linear run can be avoided. In the case of very thin metal sheets or workpieces of low thermal conductivity, additional cooling of the workpiece with liquid nitrogen or other cooling agents may be necessary.

The above examples clearly show that, by quenching precursor melts, the inventive method for the first time provides clathrate compounds that have excellent phase purity and are obtained in the form of thin layers with thicknesses in the micrometer range and, if desired, directly on a substrate to be coated therewith.

The invention claimed is:

1. A method for producing a clathrate compound, comprising producing a homogeneous melt containing clathrate precursor elements in a desired ratio and subsequently solidifying said melt by cooling said melt at a cooling rate of at least $10^3$ K/s by direct contact with a cooling agent to obtain the clathrate compound as a substantially pure crystal phase, without subsequent annealing.

2. The method according to claim 1, wherein an intermetallic clathrate is produced.

3. The method according to claim 2, wherein matrix or cage components of the clathrate are selected from the group consisting of Si, Ge, Sn, Pb, Al, Ga, In, transition elements, and combinations thereof.

4. The method according to claim 2, wherein inclusion components of the clathrate are selected from the group consisting of alkaline earth metals, lanthanoids, and combinations thereof.

5. The method according to claim 1, wherein the melt comprises thin layers or droplets with a thickness or diameter, respectively, of less than 300 µm, which thin layers or droplets are quickly cooled.

6. The method according to claim 5, wherein the thin layers or droplets of the melt have a thickness or diameter of less than 100 µm.

7. The method according to claim 1, wherein the cooling of the melt is effected at a rate of at least $10^5$ K/s.

8. The method according to claim 1, wherein the cooling of the melt is effected by introducing the melt into a cooling agent.

9. The method according to claim 8, wherein the cooling agent has a temperature of less than 5° C.

10. The method according to claim 1, wherein the cooling of the melt is effected by spreading the melt on a surface.

11. The method according to claim 10, wherein the surface is cooled before and/or during spreading of the melt.

12. The method according to claim 11, wherein the surface is cooled to a temperature of less than 5° C.

13. The method according to claim 10, wherein the melt is sprayed onto the surface through a nozzle.

14. The method according to claim 13, wherein at least one of the surface and the nozzle is moved during application of the melt.

15. The method according to claim 14, wherein the surface is rotated.

16. The method according to claim 13, wherein the surface is rotated at a rotational speed of at least 1,300 rpm.

17. The method according to claim 8, wherein the melt is kept in a state of electromagnetic levitation before cooling and then allowed to fall into said cooling agent by discontinuing the state of levitation.

18. The method according to claim 10, wherein the melt is kept in a state of electromagnetic levitation before cooling and then allowed to fall onto said surface by discontinuing the state of levitation.

19. The method according to claim 18, wherein the melt is flattened between two surfaces when the state of levitation is discontinued.

20. The method, according to claim 5, wherein the thin layers or droplets of the clathrate compound obtained by cooling are subsequently compacted into blocks.

21. The method according to claim 10, wherein the surface on which the melt is spread is the surface of a substrate or article to be coated with the clathrate compound.

22. The method according to claim 21, wherein the surface of the article is precoated with a primer coating.

23. The method according to claim 21 wherein the melt is spread on the surface of the substrate or article to form a coating having a layer thickness of 10 to 300μ.

24. The method according to claim 21 wherein the melt is spread on the surface of the substrate or article to form a coating having a layer thickness of 10 to 100μ.

\* \* \* \* \*